(12) United States Patent
Yang et al.

(10) Patent No.: US 12,301,033 B2
(45) Date of Patent: May 13, 2025

(54) CASE BODY AND CHARGING PILE

(71) Applicant: Sungrow Power Supply Co., Ltd., Hefei (CN)

(72) Inventors: Yuefeng Yang, Anhui (CN); Nan Huang, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 667 days.

(21) Appl. No.: 17/500,783

(22) Filed: Oct. 13, 2021

(65) Prior Publication Data

US 2022/0123566 A1    Apr. 21, 2022

(30) Foreign Application Priority Data

Oct. 16, 2020   (CN) .......................... 202022312172.6

(51) Int. Cl.
*H05K 5/02*     (2006.01)
*H02J 7/00*     (2006.01)
*H05K 7/20*     (2006.01)

(52) U.S. Cl.
CPC .......... *H02J 7/0042* (2013.01); *H05K 5/0217* (2013.01); *H05K 7/20909* (2013.01)

(58) Field of Classification Search
CPC ............. H05K 5/0217; H05K 7/20909; H05K 7/20145; H05K 7/20972; H05K 7/20209; H05K 7/20172; H05K 7/20845; H02J 7/0042; Y02T 90/16; Y02T 10/70; Y02T 10/7072; Y02T 90/12; Y02T 90/14; B60L 53/302; B60L 58/26; B60L 53/30
See application file for complete search history.

(56) References Cited

U.S. PATENT DOCUMENTS 5,461,299 A * 10/1995 Bruni .................... B60L 53/305
                                                    320/108
6,463,743 B1 * 10/2002 Laliberte ................. F25B 21/04
                                                     62/3.6

(Continued)

FOREIGN PATENT DOCUMENTS

| CN | 206797165 U    | 12/2017 |
|----|----------------|---------|
| EP | 0 900 621 A2   | 3/1999  |
| WO | WO 2016/156569 A1 | 10/2016 |

OTHER PUBLICATIONS

Extended European Search Report for European Application No. 21202507.6, dated Mar. 2, 2022.

*Primary Examiner* — Adam B Dravininkas
(74) *Attorney, Agent, or Firm* — Wolf, Greenfield & Sacks, P.C.

(57)    ABSTRACT

A case body and charging pile. The case body includes a shell, a partition, electrical components and a heat dissipation assembly. The partition is arranged in the shell so as to divide the shell into a first cavity of sealed cavity and a second cavity, and the shell is provided with an air inlet and an air outlet in communication with the second cavity; the electrical component is arranged in the first cavity; the heat dissipation assembly is arranged in the second cavity and used for dissipating heat to the electrical component. With the shell being divided into a first cavity and a second cavity, the heat dissipation assembly is separated from the electrical components. Therefore, cleaning water may be directly flushed into the second cavity through the air inlet and/or the air outlet to clean the heat dissipation assembly.

9 Claims, 5 Drawing Sheets

(56) References Cited

U.S. PATENT DOCUMENTS

| | | | |
|---|---|---|---|
| 8,611,088 B2* | 12/2013 | Barna | H05K 7/20918 165/122 |
| 2001/0003414 A1* | 6/2001 | Kajiura | H02J 7/0042 320/108 |
| 2004/0227435 A1* | 11/2004 | Rasmussen | H05K 7/20572 312/236 |
| 2010/0302728 A1* | 12/2010 | Knaup | H05K 7/20918 361/690 |
| 2014/0268563 A1 | 9/2014 | Sagneri et al. | |
| 2017/0238445 A1* | 8/2017 | Falk | H02M 7/44 361/694 |
| 2019/0016219 A1* | 1/2019 | Groß | H01M 10/6568 |
| 2019/0020206 A1* | 1/2019 | Reber | H02J 7/0042 |
| 2019/0106004 A1* | 4/2019 | Heyne | B60L 53/14 |
| 2019/0239396 A1* | 8/2019 | Hwang | H05K 7/20909 |
| 2020/0039369 A1* | 2/2020 | Burgermeister | B60L 53/18 |
| 2020/0338673 A1* | 10/2020 | Shu | B23K 37/0282 |

* cited by examiner

CASE BODY AND CHARGING PILE

CROSS REFERENCE TO RELATED APPLICATIONS

The present application claims the priority to Chinese Patent Application No. 202022312172.6 titled "CASE BODY AND CHARGING PILE", filed with the China National Intellectual Property Administration on Oct. 16, 2020.

FIELD

The present disclosure relates to the technical field of case equipment, and in particular to a case body and charging pile.

BACKGROUND

Currently, in the case body used in a charging pile, heat dissipation assembly is typically provided inside the shell for heat dissipating to the electrical components therein, and a mass of dust may be accumulated to the surface of the heat dissipation assembly due to effect of static electricity. However, in such case body, all heat dissipation assembly and electrical components are mounted in the same chamber, and thus it is difficult to clean the heat dissipation assembly directly, since heat dissipation assembly has to be removed from the shell before cleaning. Thus, it is inconvenience for the cleaning work.

SUMMARY

An object of the present disclosure is direct to provide a case body and a charging pile, which may directly wash the heat dissipating components and is convenient to clean.

In order to achieve said object, the following technical solutions are provided in the present disclosure.

A case body, including:
a shell;
a partition arranged in the shell to divide the shell into a first cavity, which is a sealed cavity, and a second cavity, wherein an air inlet and an air outlet in communication with the second cavity are provided in the shell;
an electrical component arranged in the first cavity; and
a heat dissipation assembly arranged in the second cavity and used for dissipating heat to the electrical component.

Preferably, the heat dissipation assembly is arranged directly opposite to the air inlet and/or the air outlet.

Preferably, the shell comprises a cover plate and a bottom cover, the cover plate is connected to the bottom cover, and the partition is arranged between the cover plate and the bottom cover, the first cavity is formed by a space enclosed by the cover plate and the partition, and the second cavity is formed by a space enclosed by the bottom cover and the partition, the air inlet and the air outlet are arranged in the bottom cover.

Preferably, the air inlets are provided in at least two side walls of one same end of the second cavity.

Preferably, the bottom cover includes:
a bottom plate, a bottom plate, one end of which is provided with a first air inlet;
two first side plates oppositely arranged and connected with the bottom plate, a second air inlet is provided at one end of the two first side plates close to the first air inlet; and
a second side plate located between the two first side plates and connected to the bottom plate and the two first side plates, respectively, a third air inlet is provided in the second side plate.

Preferably, the heat dissipation assembly includes a heat dissipation fan, the heat dissipation fan includes: a mounting member, the mounting member is fixed on an inner wall of the second cavity; and a fan body arranged on the mounting member and located between the mounting member and the third air inlet.

Preferably, the mounting member includes a first mounting plate and a second mounting plate connected to the first mounting plate, the first mounting plate is parallel and connected to the partition, and the second mounting plate is parallel to the second side plate, the fan body is arranged on the second mounting plate.

Preferably, the heat dissipation assembly further includes: a radiator, which includes a heat transfer portion and a heat dissipation portion, and the air inlet and the air outlet are respectively arranged at opposite ends of the second cavity, the heat dissipation fan and the heat dissipation portion are arranged in sequence along an air inlet direction, the heat transfer portion abuts against the electrical component in the first cavity.

Preferably, the heat transfer portion is mounted on the partition, and the partition is provided with a through hole, the heat transfer portion is attached to the electrical component in the first cavity through the through hole, a sealing ring is arranged between an inner wall of the through hole and the heat transfer portion, the sealing ring is arranged circumferential on the heat transfer portion and abuts against the partition and the heat transfer portion, respectively;
the partition is arranged in the cover plate or in the bottom cover, and a sealing element is provided circumferential on the partition, and abuts against the cover plate or the bottom cover.

A charging pile includes the case body.

Preferably, the charging pile further includes a power source arranged in the first cavity; a charger connector, one end of which is connected to the power source, and the other end of the charger connector is to be coupled with the structure to be charged; and a charging control component arranged in the first cavity.

Preferably, the air inlet is arranged at the bottom end of the case body.

The beneficial effects of the present disclosure: a case body and a charging pile are provided according to the present disclosure. The case body is used in a charging pile. In the case body, the electrical components are placed in a sealed cavity, and the heat dissipation assembly is placed in the second cavity, so that the heat dissipation assembly is separated from the electrical components. Therefore, cleaning water may be directly flowed into the second cavity through the air inlet and/or the air outlet so as to clean the heat dissipation assembly, and the heat dissipation assembly does not need to be removed from the shell of the case body before cleaning. Thus it provides more convenience to clean the heat dissipation assembly.

Reference numerals in the drawings are listed as follows:

1 cover plate; 2 bottom cover; 21 air inlet; 211 first air inlet; 212 second air inlet; 213 third air inlet; 22 air outlet; 23 bottom plate; 24 first side plate; 25 second side plate; 3 heat dissipation assembly; 31 radiator; 32 heat dissipation fan; 321 mounting member; 3211 first mounting plate; 3212 second mounting plate; 322 fan body; 4 partition.

DETAILED DESCRIPTION OF THE EMBODIMENTS

In order to make the technical problems solved by the present disclosure, the technical solutions adopted and the technical effects achieved more clearly, the technical solutions of the present disclosure will be further explained below in conjunction with the drawings and embodiments.

In the description of the present disclosure, it should be pointed out that, terms "link", "connect" and "fix" should be understood broadly, unless otherwise specifically defined. For example, it may be fixedly connected or detachably connected or integrally connected; it may be mechanically connected or electrically connected; it may be directly connected or indirectly connected through intermediate media, or inner parts of two components are in communication with each other, or the interaction between the two components. For those skilled in the art, the specific meaning of the above terms in the present disclosure may be understood in the light of specific circumstances.

In the present disclosure, unless otherwise specified and limited, the first feature "on" or "under" the second feature may include direct contact between the first and second features, and may also include that the first and second features are not in direct contact but through another feature contact between them. Furthermore, "above", "over" and "on" the second feature includes that the first feature is directly above and obliquely above the second feature, or simply indicates that the first feature is higher in horizontal height than the second feature. The fact that the first feature is "below", "under" and "down" the second feature includes that the first feature is directly below and obliquely below the second feature, or simply means that the first feature is lower in horizontal height than the second feature.

In the description of the present disclosure, the orientation or positional relationships indicated by terms "up", "down", "left", "right" and the like are based on the orientation or positional relationships shown in the drawings, and are merely for the convenience of describing the present disclosure and the simplification of the description, and do not indicate or imply that the device or element referred to must be in a particular orientation, or be constructed and operated in a particular orientation, and therefore should not be construed as a limit to the scope of the present disclosure. In addition, the terms "first" and "second" are only used to distinguish them in description, and have no special meaning.

Figure 1:
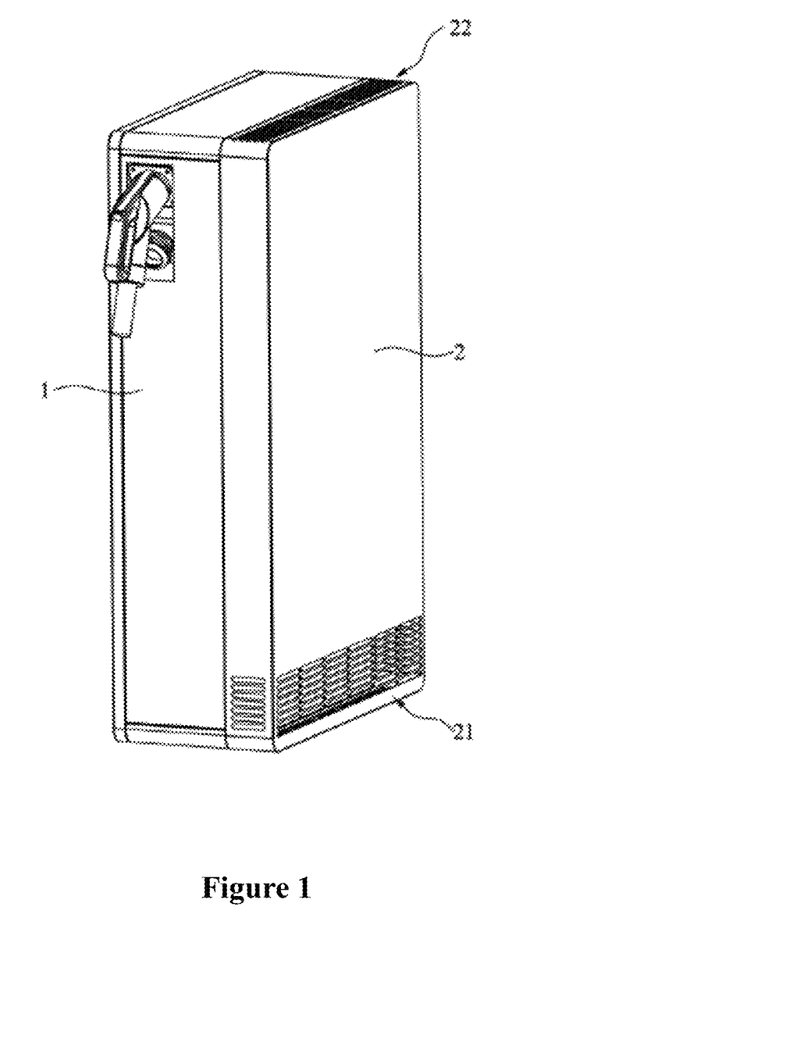
FIG. 1 is a schematic view of the overall structure of the case body according to the embodiment of the present disclosure.
Figure 2:
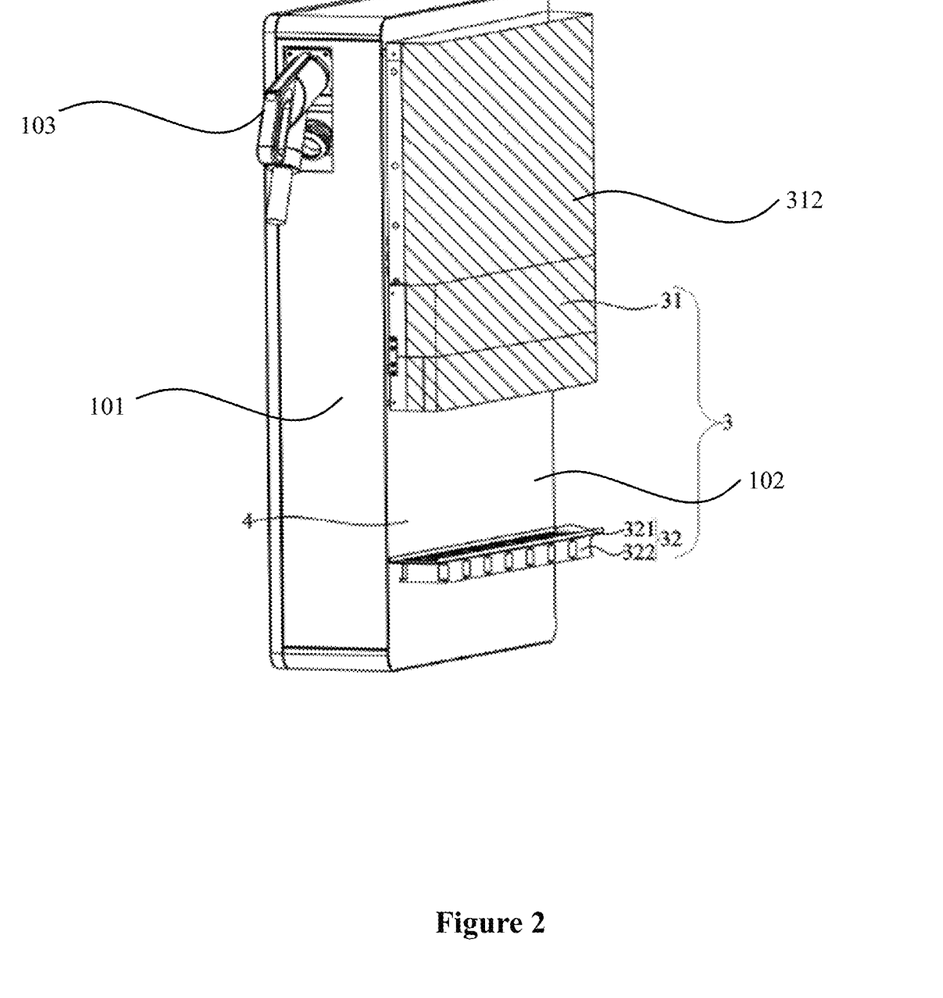
FIG. 2 is a schematic structural view of the case body according to the embodiment of the present disclosure with the bottom cover removed.

As shown in FIG. 1 and FIG. 2, the case body includes a shell, a partition 4, electrical components, and a heat dissipation assembly 3. The shell protects the components inside the case body, and the partition 4 is arranged in the shell so as to divide the shell into a first cavity 101, which is a sealed cavity, and a second cavity 102. An air inlet 21 and an air outlet 22, which are in communication with the second cavity 102, are provided in the shell. The electrical components are arranged in the first cavity 101 and used to perform the normal operations of the case body. The heat dissipation assembly 3 is arranged in the second cavity 102 and is used for dissipating heat of the electrical components.

In the embodiment, the electrical components are located in the first cavity, and the heat dissipation assembly 3 is located in the second cavity, being separated from the electrical components. In that case, it facilitates the cleaning liquid being flowed into the second cavity through the air inlet 21 and/or the air outlet 22 in order to clean the heat dissipation assembly 3, and the heat dissipation assembly 3 does not need to be removed from the shell before cleaning. It is more convenient to clean the heat dissipation assembly 3.

Specifically, as shown in FIG. 1 and FIG. 2, the shell includes a cover plate 1 and a bottom cover 2. The cover plate 1 and the bottom cover 2 are connected so as to form a shell, and the partition 4 is arranged between the cover plate 1 and the bottom cover 2. The space enclosed by the cover plate 1 and the partition 4 forms the first cavity, and the space enclosed by the bottom cover 2 and the partition 4 enclose the second cavity. Both the air inlet 21 and the air outlet 22 are arranged in the bottom cover 2.

Preferably, the cover plate 1 and the bottom cover 2 may be fixed in a manner of snap-fit, which not only provide the good sealing performance but also is easy to be disassembled.

Preferably, as shown in FIG. 1 and FIG. 2, the heat dissipation assembly 3 includes a heat dissipation fan 32 which is arranged directly opposite to the air inlet 21. When cleaning the heat dissipation fan 32, the cleaning water may flow into the second cavity from the air inlet 21, which facilitates of flushing to the heat dissipation fan 32, and thus to clean the heat dissipation fan 32. In other embodiments, the heat dissipation fan 32 may either be arranged directly opposite to the air outlet 22, or arranged directly opposite to both the air inlet 21 and the air outlet 22. In the present disclosure, these three configurations: the heat dissipation fan 32 is arranged directly opposite to the air inlet 21, arranged directly opposite to the air outlet 22, or arranged directly opposite to both the air inlet 21 and the air outlet 22, can be determined without special limitation as long as it facilitates the heat dissipation fan 32 of being cleaned via the air inlet 21 and/or the air outlet 22.

Preferably, air inlets 21 are provided in at least two side walls at the one same end of the second cavity, and thus the air-intake flow rate, on one hand, may be increased and it could provide more cleaning directions to the heat dissipation fan 32, thereby improving the heat dissipation effect and the cleaning effect, and on the other hand, during cleaning the heat dissipation fan 32, water may be flowed through one of the air inlets 21 at the one same end of the second cavity, and drained from the rest air inlets 21. This ensures that the used water is drained only after contacting the heat dissipation fan 32 rather than flowing to the rest of the space in the second cavity, which could avoid contacting with certain structures that do not need cleaning, and avoid impurities in sewage from depositing in the case body.

Figure 3:
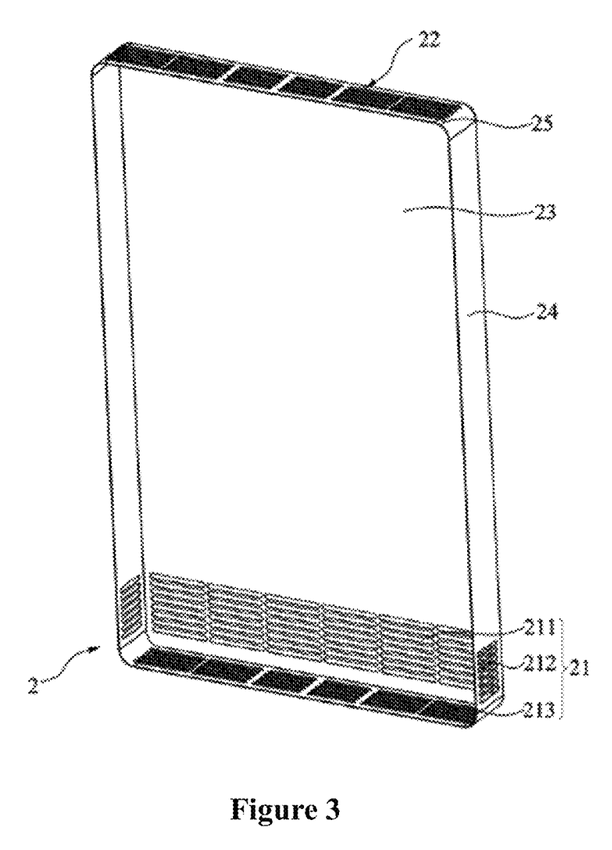
FIG. 3 is a schematic view of the structure of the bottom cover according to the embodiment of the present disclosure.

In the embodiment, air inlets 21 are provided in all four side walls of the second cavity. As shown in FIG. 3, the bottom cover 2 includes a bottom plate 23, two first side plates 24 and two second side plates 25. A first air inlet 211 is provided at one end of the bottom plate 23. Two opposite first side plates 24 are connected to the bottom plate 23. A second air inlet 212 is arranged at one end of each first side plate 24 close to the first air inlet 211. The second side plates 25 are located between the two first side plates 24 and are connected to the bottom plate 23 and the two first side plates 24, respectively. A third air inlet 213 is arranged on the second side plate 25.

Furthermore, when cleaning the heat dissipation fan 32, the case body may be adjusted so that the third air inlet 213 is positioned downward. It facilitates the used water to be naturally drained out of the case body under the action of gravity.

In the embodiment, the case body has a structure in shape of rectangular parallelepiped. Correspondingly, the bottom plate 23 is rectangular, and two second side plates 25 are provided so as to close the four sides of the bottom cover 2. In other embodiments, other specific shapes of the case body may be set as required.

In this embodiment, as shown in FIG. 2 and FIG. 3, the heat dissipation fan 32 includes a mounting member 321 fixed on the inner wall of the second cavity and a fan body 322. The fan body 322 is provided in the mounting member 321 and located between the mounting member 321 and the third air inlet 213, which ensures the fan body 322 and the third air inlet 213 are arranged directly opposite to each other, and thus it facilitates water to enter from the third air inlet 213, and to be drained through the second air inlet 212 on both sides and the adjacent first air inlet 211, which makes cleaning be more convenient.

Figure 4:
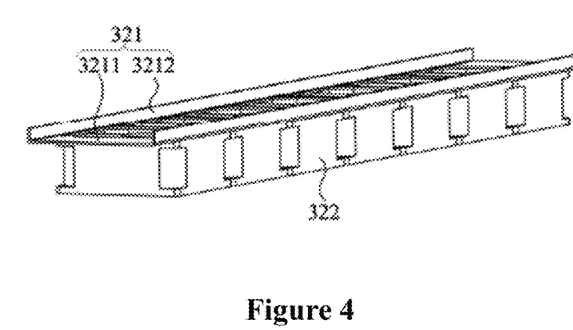
FIG. 4 is a schematic view of the structure of the heat dissipation fan according to the embodiment of the present disclosure.

Specifically, as shown in FIG. 4, the mounting member 321 includes a first mounting plate 3211 and a second mounting plate 3212 connected to the first mounting plate 3211, the first mounting plate 3211 is paralleled connected to the second side plate 25, and the second mounting plate 3212 is paralleled to the partition 4, The fan body 322 is arranged on the second mounting plate 3212. On one hand, the structure of the mounting member 321 is beneficial to the arrangement of the fan body 322 being opposite to the third air inlet 213, on the other hand, the second mounting plate 3212 may be functioned as blocking the cleaning water so as to avoid the cleaning water from flowing to the other side of the second mounting plate 3212. It may block the cleaning water and cause cleaning water turn back so as to be drained through the second air inlet 212 on both sides and the adjacent first air inlet 211.

Preferably, as shown in FIG. 2, the heat dissipation assembly 3 further includes a radiator 31, which includes a heat transfer portion and a heat dissipation portion 312. The air inlet 21 and the air outlet 22 are respectively arranged at opposite ends of the second cavity, the heat dissipation fan 32 and the heat dissipation portion 312 are arranged in sequence along the air inlet direction, and the heat transfer portion is attached to the electrical components in the first cavity so as to transfer the heat generated by the electrical components. The arrangement of the heat dissipation fan 32 and the heat dissipation portion 312 being arranged in sequence along the air inlet direction could effectively prevent sewage (the used water formed after cleaning the heat dissipation fan 32) from contacting the heat dissipation portion 312.

Figure 6:
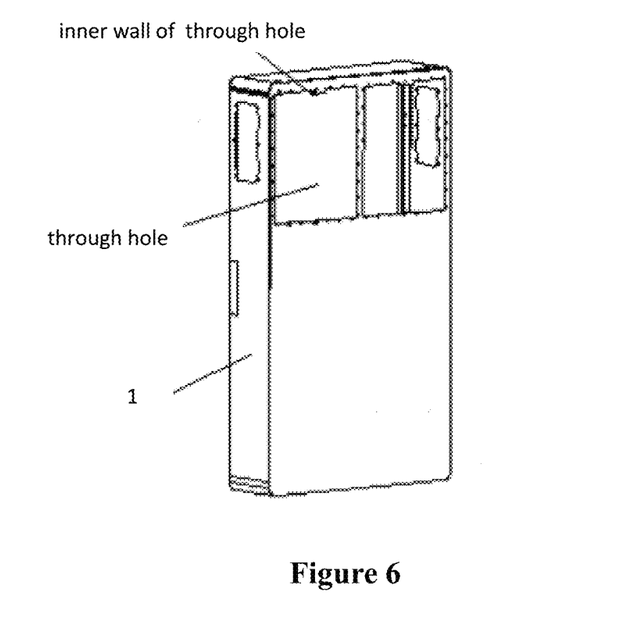
FIG. 6 is a schematic structural view of a through hole formed in a partition according to the embodiment of the present disclosure.
Figure 7:
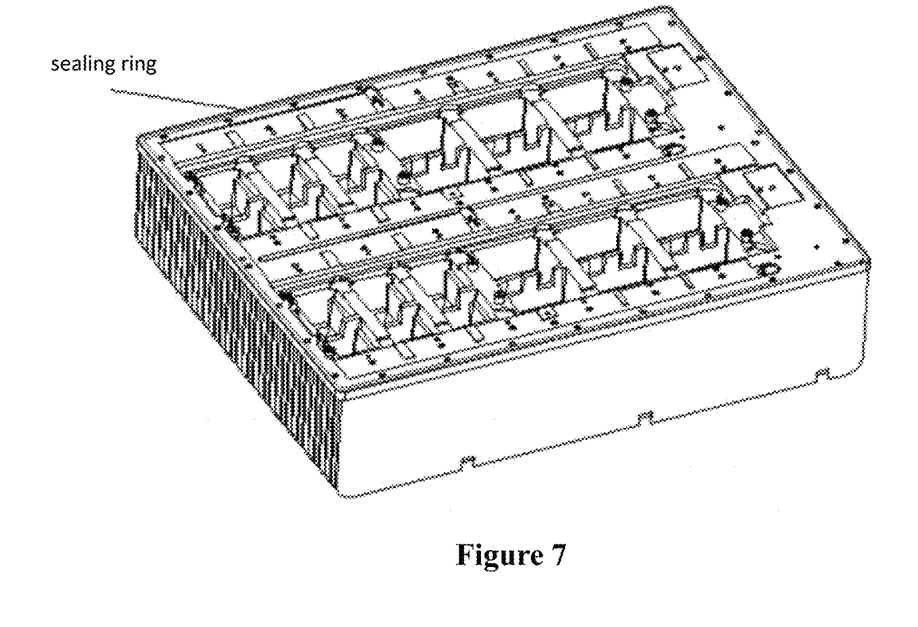
FIG. 7 is a schematic view of a sealing ring according to the embodiment of the present disclosure.

In order to improve the sealing effect of the first cavity, as shown in FIG. 2, the heat transfer portion is mounted on the partition 4. As shown in FIG. 6, a through hole is provided in the partition 4, and the heat transfer portion is attached to the electrical components in the first cavity through the through hole. As shown in FIG. 6 and FIG. 7, a sealing ring, which is arranged circumferential on the heat transfer portion, is provided between an inner wall of the through hole and the heat transfer portion. The sealing ring abuts against the partition 4 and the heat transfer portion, respectively. This configuration not only ensures the communication between the radiator 31 and the electrical components in the first cavity, and effectively transfer the heat generated by the electrical components, but also ensures the sealing performance of the first cavity.

Preferably, as shown in FIG. 2, the partition 4 is arranged in the cover plate 1, and a sealing element is provided circumferential on the partition 4, and the sealing element abuts against the cover plate 1 to ensure the sealing effect of the first cavity. In other embodiments, the partition 4 may optionally be arranged in the bottom cover 2, and the sealing element provided circumferential on the partition 4 abuts against the bottom cover 2. The present disclosure does not specifically limit whether the partition 4 is arranged either in the cover plate 1 or the bottom cover 2.

In order to further improve the sealing effect of the first cavity, the cover plate 1 includes a top plate and a side wall plate, which is connected to the top plate in the circumferential direction. The partition 4 is connected to the side wall plate, and the side wall plate of the cover plate 1 extends to the side of the partition 4 away from the top plate and is connected to the bottom cover 2, which may prevent the partition 4 from being arranged at the junction of the cover plate 1 with the bottom cover 2. Therefore it could avoid unnecessary connection gaps so as to improve the sealing effect of the first cavity.

Figure 5:
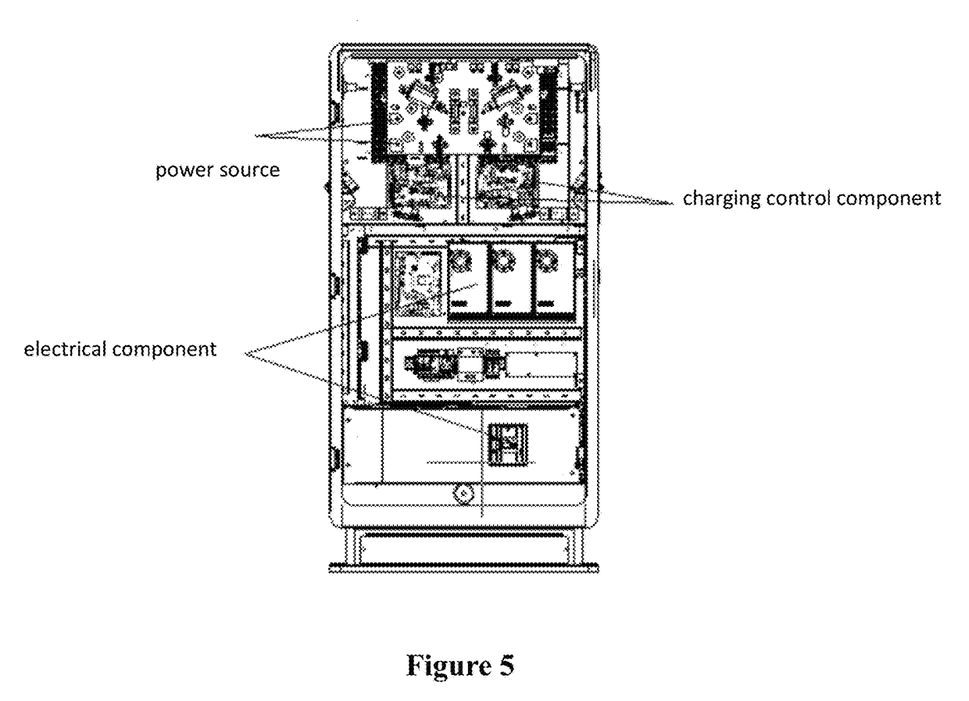
FIG. 5 is a schematic structural view of components inside a first cavity according to the embodiment of the present disclosure.

As shown in FIG. 5, the present disclosure further provides a charging pile, which includes a power source, a charger connector 103, a charging control assembly and the aforementioned case body, the power source and the charging control component are both arranged in the first cavity. One end of the charger connector 103 is connected with the power source, and the other end may be coupled with the structure to be charged.

In the embodiment, the case body is provided with heat dissipation function, which may dissipate to the electrical components, power source, and charging control component in the first cavity through the heat dissipation assembly 3, so as to prevent the charging pile from being in abnormal operation due to excessive high temperature. The heat dissipation fan 32 is arranged in the second cavity and may be directly flushed by water, which facilitates for cleaning.

It should be understood that, due to a large size of the charging pile with poor mobility, the air inlet 21 may be provided at the bottom end of the case body to facilitate cleaning of the heat dissipation fan 32.

Obviously, the above embodiments of the present disclosure are merely examples to clearly illustrate the present disclosure, and are not intended to limit the implementation of the present disclosure. For those of ordinary skill in the art, other changes or modifications in different forms can be made on the basis of the above description. It is unnecessary and impossible to list all the implementations here. Any modifications, equivalent substitutions or modifications made within the spirit and principle of the present disclosure shall fall within the protection scope of the present disclosure.

What is claimed is:

1. A case body, comprising:
a shell;
a partition arranged in the shell to divide the shell into a first cavity, which is a sealed cavity, and a second cavity, wherein an air inlet and an air outlet in communication with the second cavity are provided in the shell;
an electrical component arranged in the first cavity; and
a heat dissipation assembly arranged in the second cavity and configured for dissipating heat to the electrical component,
wherein the shell comprises a cover plate and a bottom cover, the cover plate is connected to the bottom cover, and the partition is arranged between the cover plate and the bottom cover, the first cavity is formed by a space enclosed by the cover plate and the partition, and the second cavity is formed by a space enclosed by the bottom cover and the partition, the air inlet and the air outlet are arranged in the bottom cover,
wherein the air inlets are provided in at least two side walls of one same end of the second cavity,
the bottom cover comprises:
a bottom plate, one end of which is provided with a first air inlet;
two first side plates oppositely arranged and connected with the bottom plate, a second air inlet is provided at one end of the two first side plates close to the first air inlet; and
a second side plate located between the two first side plates and connected to the bottom plate and the two first side plates, respectively, a third air inlet is provided in the second side plate.

2. The case body according to claim 1, wherein the heat dissipation assembly is arranged directly opposite to the air inlet and/or the air outlet.

3. The case body according to claim 1, wherein the heat dissipation assembly comprises a heat dissipation fan, the heat dissipation fan comprises:
a mounting member fixed on an inner wall of the second cavity; and
a fan body arranged on the mounting member and located between the mounting member and the third air inlet.

4. The case body according to claim 3, wherein the mounting member comprises a first mounting plate and a second mounting plate connected to the first mounting plate, the first mounting plate is parallel and connected to the partition, and the second mounting plate is parallel to the second side plate, the fan body is arranged on the second mounting plate.

5. The case body according to claim 1, wherein the heat dissipation assembly further comprises: a radiator, which comprises a heat transfer portion and a heat dissipation portion,
wherein the air inlet and the air outlet are respectively arranged at opposite ends of the second cavity, the heat dissipation fan and the heat dissipation portion are arranged in sequence along an air inlet direction.

6. The case body according to claim 5, wherein the heat transfer portion is mounted on the partition, and the partition is provided with a through hole, the heat transfer portion is attached to the electrical component in the first cavity through the through hole, a sealing ring is arranged between an inner wall of the through hole and the heat transfer portion, the sealing ring is arranged circumferential on the heat transfer portion, and abuts against the partition and the heat transfer portion, respectively;
wherein the partition is arranged in the cover plate or in the bottom cover.

7. A charging pile, comprising the case body according to claim 1.

8. The charging pile according to claim 7, further comprising a power source arranged in the first cavity;
a charger connector, one end of the charger connector is connected to the power source, and the other end of the charger connector is to be coupled with a structure to be charged; and
a charging control component arranged in the first cavity.

9. The charging pile according to claim 7, wherein the air inlet is arranged at the bottom end of the case body.

* * * * *